United States Patent [19]
Spencer

[11] 3,932,819
[45] Jan. 13, 1976

[54] ELECTRICAL FILTERS

[75] Inventor: Paul Anthony Spencer, London, England

[73] Assignee: Dolby Laboratories, Inc., New York, N.Y.

[22] Filed: Oct. 18, 1974

[21] Appl. No.: 515,843

Related U.S. Application Data

[62] Division of Ser. No. 346,629, March 30, 1973.

[30] Foreign Application Priority Data

Apr. 4, 1972 United Kingdom............... 15485/72

[52] U.S. Cl. ......... 328/167; 178/DIG. 12; 330/126; 333/70 R
[51] Int. Cl.² ........................................ H04B 1/04
[58] Field of Search............ 328/167; 333/14, 70 R; 178/DIG. 12; 179/1 P; 358/31, 36, 38; 330/126

[56] References Cited
UNITED STATES PATENTS

| | | | |
|---|---|---|---|
| 2,217,839 | 10/1940 | Grundman | 330/126 |
| 3,325,753 | 6/1967 | Shearer et al. | 330/126 X |
| 3,531,652 | 9/1970 | Aemmer et al. | 333/76 X |

*Primary Examiner*—James B. Mullins
*Attorney, Agent, or Firm*—Robert F. O'Connell

[57] ABSTRACT

A filter performs a dual filtering function by connecting an input terminal through a first impedance such as a resistor to a first output terminal. The input terminal is connected to a virtual earth at the input to a current amplifier through the first impedance and a second impedance such as a tuned circuit. The output of the amplifier is connected to a second output terminal and also to ground through a third impedance such as a resistor. The characteristics at the first and second output terminals may be complementary band stop and band pass characteristics.

7 Claims, 5 Drawing Figures

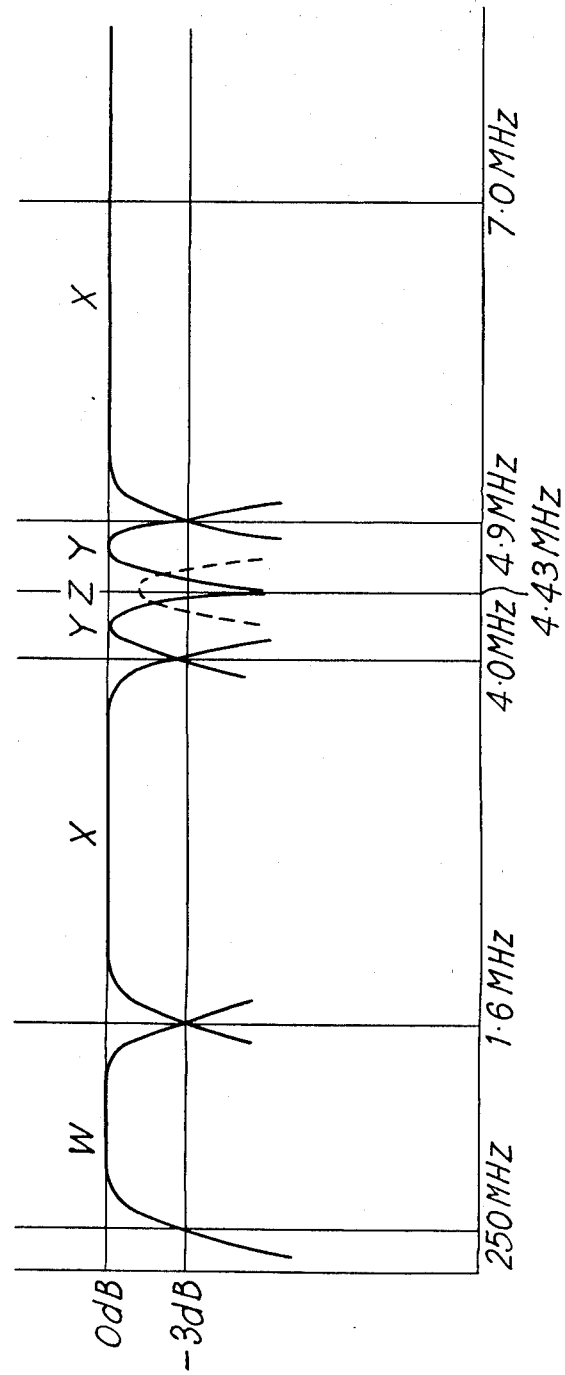

ELECTRICAL FILTERS

This is a division of application Ser. No. 346,629, filed on Mar. 30, 1973.

This invention relates to filters adapted to split an input signal into two signals occupying different parts of a frequency band. One situation in which such a filter may be employed is the separation of chrominance and luminance signals from a colour television signal. The normal technique for effecting this is to employ a band-stop filter with a notch at the colour sub-carrier frequency to extract the luminance signal, slightly contamined with sidebands of the chrominance signal, and a bandpass filter with a pass band centred on the colour sub-carrier frequency and complementary to the notch to extract the chrominance signal, contaminated with such upper sidebands of the luminance signals as may be present. However, there are situations, such as those explained below, in which noise reduction techniques are to be applied separately to different parts of the frequency spectrum, in which the relationship between the two separated signals is critical in that the signals have subsequently to be recombined.

The object of this invention is to provide a filter which can provide both of the separated signals with a precisely determined relation therebetween and which is easier to adjust and more stable than circuits employing separate filters to extract the two signals.

According to the present invention there is provided an electrical filter comprising an input terminal connected to a first output terminal through a first impedance and through the first impedance and a second impedance to the input of a current amplifier, which input constitutes a virtual earth, the output of the amplifier being connected to a second output terminal and through a third impedance to earth, at least one of the impedances being reactive.

Because of the virtual earth at the input to the current amplifier, the filter characteristics applicable to the signal derived at the first output terminal are determined solely by the first and second impedances. However, the characteristics applicable to the signal derived at the second output terminal are determined by all three impedances and the different locations which the second impedance has relative to the two output terminals renders the type of characteristics applicable to the two terminals different.

In applying the invention to the specific problem of creating complementary band pass and band stop characteristics, the first and third impedances can be substantially pure resistance. If the second impedance is a tuned circuit, which is in the shunt arm of the filter so far as the first output terminal is concerned, but in the series arm so far as the second output terminal is concerned, it is possible by correct selection of the component values to make the pass and stop characteristics truly complementary, so that the sum of the signals at the two output terminals reconstitutes the spectrum of the input signal. This property is of particular value in separating chrominance and luminance signals.

The invention will be described in more detail, by way of example, with reference to the accompanying drawings, in which:

FIG. 2 shows how the frequency band of a colour television signal may be split up for noise reduction purposes.

Figure 1:
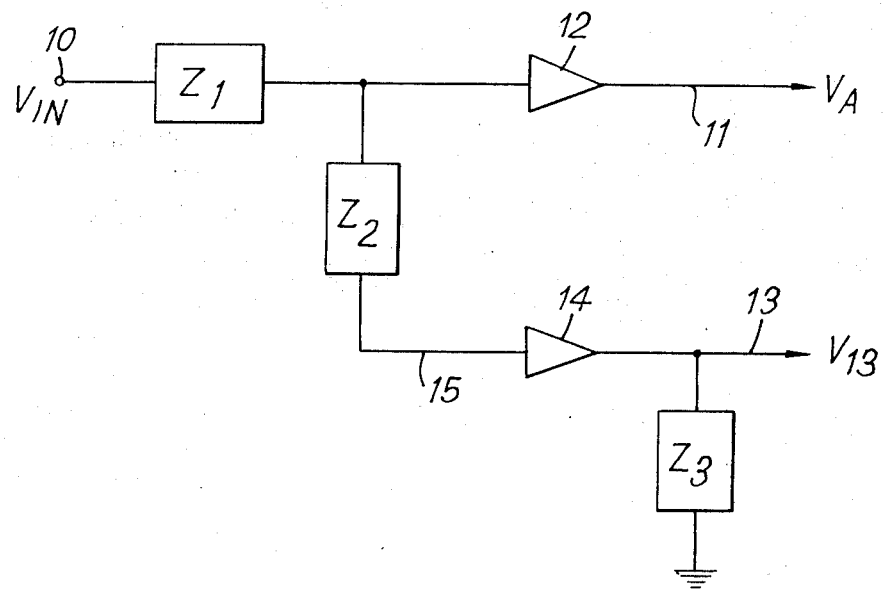
FIG. 1 is a circuit diagram of a generalized embodiment of the invention.

In FIG. 1 an input terminal 10 is connected to a first output terminal 11 through a first impedance $Z_1$ followed by a buffer amplifier 12 such as an emitter follower. The terminal 10 is also connected to a second output terminal 13 through $Z_1$ followed by a second impedance $Z_2$ and a current amplifier 14.

Ideally the amplifier 14 has zero input impedance and infinite output impedance; in practice these properties are achieved only approximately but the input 15 of the amplifier nevertheless constitutes a virtual earth. The amplifier may comprise a feedback pair amplifier or grounded base transistor amplifier. The terminal 13 is connected to earth through a third impedance $Z_3$ which is the output load impedance of the amplifier 14.

If the voltages at the terminals 10, 11 and 13 are designated $V_{IN}$, $V_A$ and $V_B$ as in FIG. 1, it can be seen that, because point 15 is a virtual earth, $$V_A = V_{IN} \cdot \frac{Z_2}{Z_1 + Z_2} \quad (1)$$

Furthermore, if the current gain of the amplifier 14 is A, $$V_B = V_{IN} \cdot \frac{AZ_3}{Z_1 + Z_2} \quad (2)$$

which reduces to $$V_B = V_{IN} \cdot \frac{Z_3}{Z_1 + Z_2}$$

when A is approximately unity, as in the case of a grounded base current amplifier.

Provided at least one of $Z_1$, $Z_2$ and $Z_3$ is reactive, a filter circuit results with different frequency characteristics applicable to the two output terminals. This will readily be seen when considering the subsequent description of the specific circuit of FIG. 2. As explained in the aforementioned specifications, effective noise reduction requires different parts of an overall frequency spectrum to be dealt with separately, and it is also necessary, when a carrier signal is present, to prevent this from choking the noise reduction action. Accordingly, the bandsplitting scheme illustrated in FIG. 2 may be employed to handle the frequency spectrum of a colour television signal. FIG. 2 is shown for the specific case of a colour sub-carrier frequency of 4.43 MHz, as employed in European PAL standards, but the same kind of scheme may obviously also be employed with other standards using a different sub-carrier frequency. Peak pass level is shown as 0dB. The −3dB points of the filter characteristics are taken as defining the limits of the various bands. The illustrated characteristics are the passive filter characteristics. It will subsequently appear that the filters defining the various bands are disposed in feedback or feed-forward loops with limiters connected thereto; the filter characteristics obviously then vary in a dynamic manner.

The frequency spectrum from about 250 KHz upwards is split into four bands labelled W, X, Y and Z. The band W from 250 KHz (say) to 1.6 MHz can be selected by a conventional bandpass filter. Ignoring the low frequency cut-off at 1.6 MHz, the characteristic X consists of a pass band with a notch therein 0.9 MHz wide extending from 4 to 4.9 MHz. The characteristic Y, ignoring the sharp notch therein at 4.43 MHz, consists of a pass band extending from 4 to 4.9 MHz, Y thus being complementary to X. It is these two characteristics which are provided by the part of the circuit of FIG. 2 embodying the present invention for splitting a signal into two bands. The low frequency cut-off of X at 1.6 MHz is superimposed by means of a high pass filter, while the notch in Y is superimposed by means of a sharply tuned sub-carrier trap. Finally, band Z is a sharply tuned pass band for handling the colour sub-carrier and its immediate sidebands.

Band W thus handles relatively low frequency luminance components, band X handles high frequency luminance components and outer chrominance sidebands, band Y handles closer chrominance sidebands and the luminance sidebands interleaved therewith, and band Z handles the sub-carrier and immediate chrominance sidebands. This scheme makes no provision for handling the lowermost luminance sidebands although, if required, the band from, say, 5 to 250 KHz can be treated as described in our application corresponding to British Patent application No. 15484/72.

Figure 3:
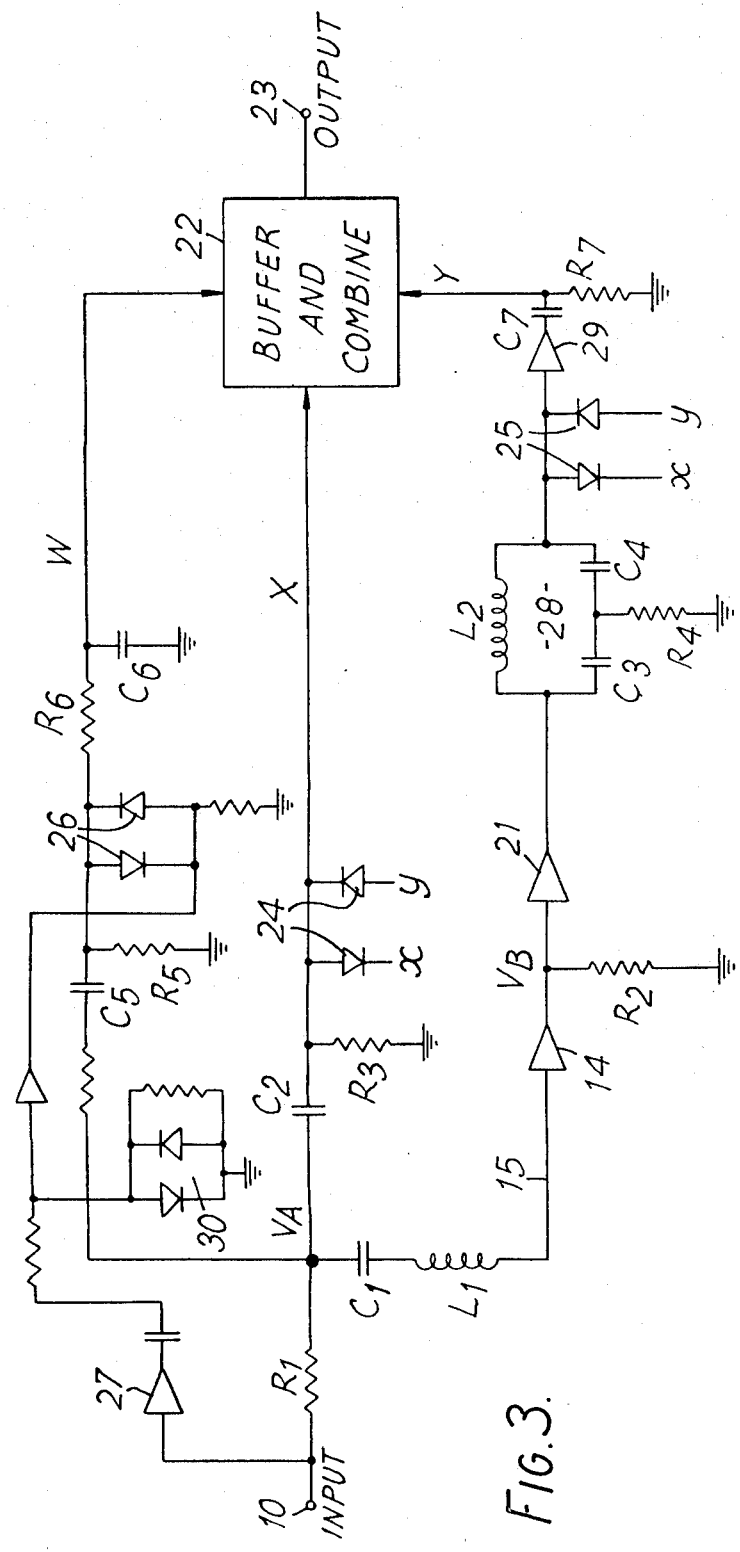
FIG. 3 is a circuit diagram of a specific embodiment of the invention for obtaining the pass bands of FIG. 2.

Referring now to FIG. 3, the part thereof corresponding to FIG. 1 will firstly be described. In FIG. 3, $Z_1$ is constituted by a resistor $R_1$, $Z_2$ is constituted by the series combination of a capacitor $C_1$ and inductor $L_1$, and $Z_3$ is constituted by a resistor $R_2$.

Equation (1) now becomes $$V_A = V_{IN} \cdot \frac{(jwL + 1/jwC)}{(R_1 + jwL + 1/jwC)} \quad (3)$$

where C and L are written for $C_1$ and $L_1$.

In other words, so far as the terminal 11 is concerned, the filter is a band-stop or notch filter tuned to the frequency $w/2\pi$ at which $jwL + 1/jwC = 0$. At this frequency $Z_2$ provides a direct short to the virtual earth at the input to the amplifier 14.

On the other hand, equation (2) becomes $$V_B = V_{IN} \cdot \frac{AR_2}{(R_2 + jwL + 1/jwC)} \quad (4)$$

from which it can be seen that, so far as the terminal 13 is concerned, the filter is a bandpass filter tuned to the same frequency as the notch filter. Furthermore, if $R_1 = AR_2$ it can be seen that, irrespective of the values of C and L, $V_A + V_B = V_{IN}$. In other words, the Qs of the band-stop and the bandpass filters are the same. This is also in fact true when $R_1 \neq AR_2$, the effect of which is merely to introduce a scaling factor between $V_A$ and $V_B$.

Although equations (3) and (4) have been written in jw notation to present the steady state conditions at any angular frequency w, it will be appreciated that the same equations hold with jw replaced by the general operator p to describe transient conditions, as well as the steady state conditions.

Figure 4:
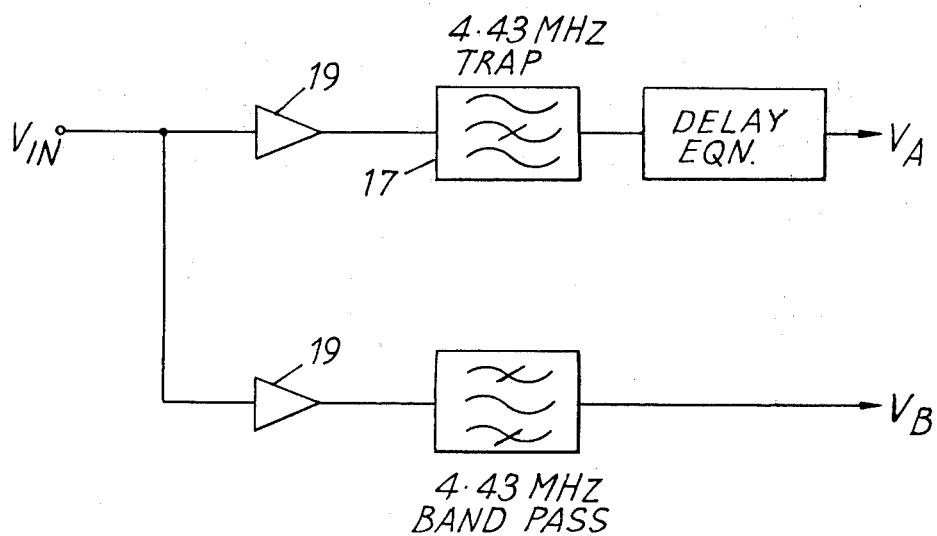
FIG. 4 illustrates a known circuit for comparison with the circuit of FIG. 3.

By way of comparison with FIG. 3, FIG. 4 shows a conventional circuit for separating luminance and chrominance components, again represented as $V_A$ and $V_B$ respectively. Separate trap and bandpass filters 17 and 18 are used, preceded by emitter follower buffers 19. The two filters have different phase delays and the trap filter has to be followed by delay equalization 20. The known circuit is substantially more complex than that of FIG. 3 and yet has a poorer performance.

It should be noted that the circuit of FIG. 4 is equivalent only to that part of FIG. 3 which has thus far been described.

Reverting to FIG. 3, the input colour signal at terminal 10 is split into band X by the notched filter $R_1$, $C_1$, $L_1$ and a 1.6 MHz high pass filter $C_2$, $R_3$ and into band Y by the bandpass filter $R_1$, $C_1$, $L_1$, $R_2$ and a sub-carrier trap filter 28. This trap filter is preceded by a buffer amplifier 21 and is of a bridged-T configuration with two series capacitors $C_3$ and $C_4$ bridged by an inductor $l_2$ and the junction of $C_3$ and $C_4$ connected to ground by resistor $R_4$. This resistor can be so adjusted that there is complete rejection at the trap frequency (4.43 MHz). It should be noted that the various ground points shown in FIG. 3 are essentially a.c. grounds; in detailed circuit design it may be convenient for some of them to have different d.c. levels.

The sub-carrier trap 28 is followed by a buffer amplifier 29 and high pass filter $C_7$, $R_7$ which does not play any part in defining the Y band but which provides a phase advance compensating for the phase advance introduced by $C_2$, $R_3$ in the X path.

Band W is selected by a 250 KHz high pass filter $C_5$, $R_5$ and a 1.6 MH$_z$ low pass filter $R_6$, $C_6$.

The signals in bands W, X and Y are recombined by a buffering and combining circuit 22 to provide the output at terminal 23. Each channel includes an instantaneous diode limiter providing limiting for signal excursions of either polarity. Diodes 24 in the X channel and diodes 25 in the Y channel are returned to fixed bias points x and y which establish a limiting action with an onset at a very low level in the dynamic range of the signals handled by the channels. Diodes 26 in the W channel have a similarly low limiting level but are returned to the output of an inverting amplifier 27 responsive to the input signal and accordingly acting so as to reduce the limiting threshold even more at high input signal levels. Diodes 30 prevent the signal from amplifier 27 becoming so large as to forward bias the diodes 26.

Figure 5:
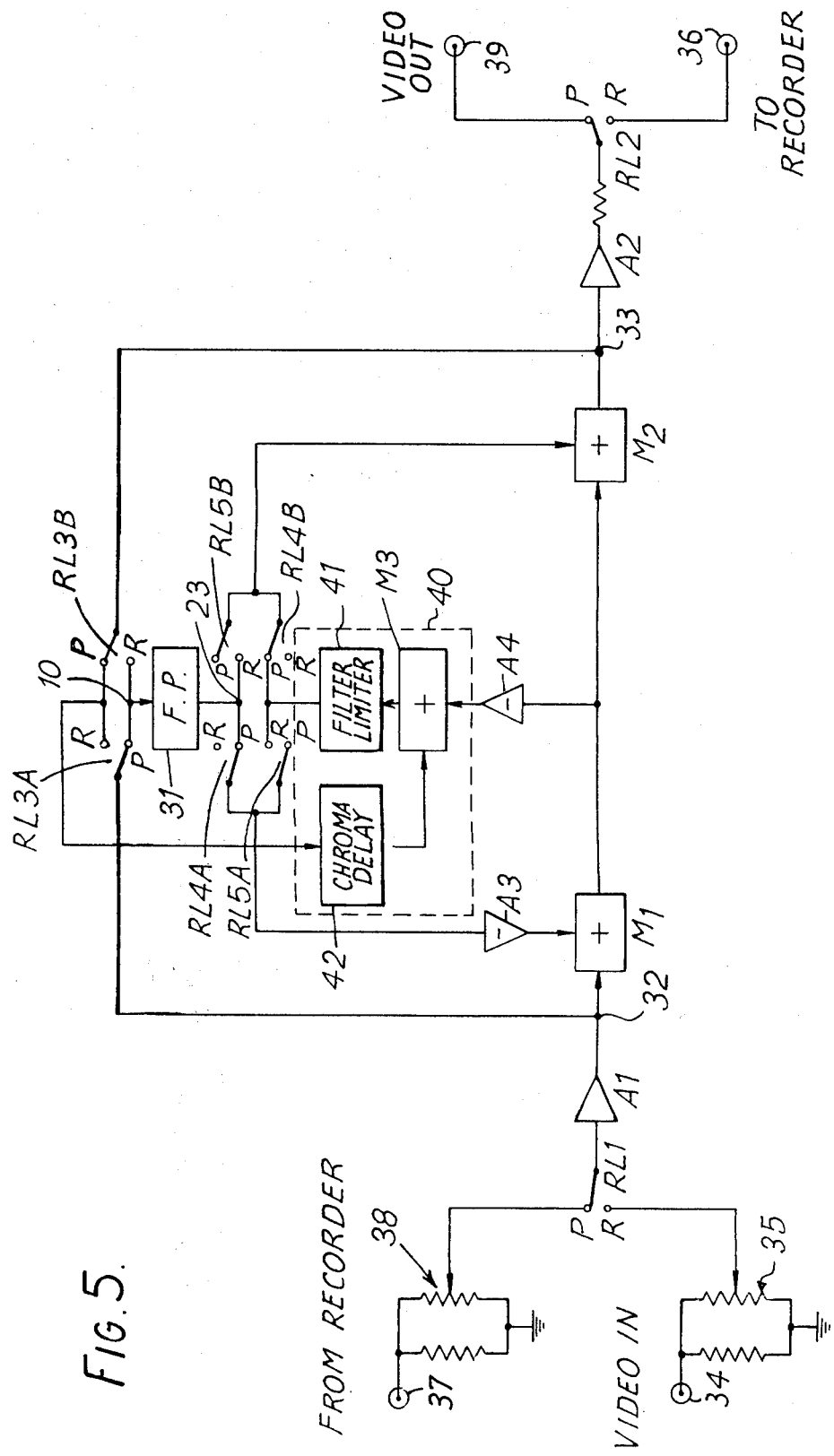
FIG. 5 shows the circuit of FIG. 3 included in a colour television noise reduction system.

The location of the circuit of FIG. 3 in the block diagram of FIG. 5 will be apparent from the terminals 10 and 23 correspondingly numbered in both figures. The circuit of FIG. 3 is a block 31 labelled F.P. in FIG. 5 to represent the further paths whose output at terminal 23 boosts the signal in a main path during recording to effect compression and bucks the signal in the main path during playback to effect expansion. The main path extends from point 32 to point 33 through mixers M1 and M2. Selection between record mode R and playback mode P is effected by ganged switches RL1 etc.

In the record made with all switches changed over from the illustrated setting, a colour video signal from input 34 and gain setting circuit 35 passes through the switch RL1 via amplifier A1 to the main path and from the output of the main path via amplifier A2 and switch RL2 to a terminal 36 for feeding a video tape recorder. The signal at the output 33 of the main path is applied to the input of the further paths via RL3B. The output from the further path adds to the signal in the main path via RL5B and mixer M2. When only low level signal components are present in band W, X or Y, the gain round the feedback loop from M2 through the further path and back to M2 causes such components to be boosted by 10dB. At higher signal levels the actions of the limiters eliminate any significant boosting action.

In the playback mode with the switches as shown, the output from the recorder is applied from terminal 37 via gain setting circuit 38, RL1 and amplifier A1 to the main path. The output from the main path passes via amplifier A2 and RL2 to a video output terminal 39. The input to the further path is now taken from the main path input 32 via RL3A while the output from the further path passes via RL4A and an inverting amplifier A3 to M1 so as now to buck the main path signal.

Thus, utilizing the terminology established in British patent specification No. 1,253,031 the compressors and expanders are Type 2 with the input to the further path connected to the output of the main path in the case of the compressor and to the input of the main path in the case of the expander. The further paths of FIG. 3 may equally well be embodied in Type 1 devices in which the input to the further path is connected to the input of the main path in the case of the compressor and to the output of the main path in the case of the expander.

Although forming no part of the present invention, the remainder of FIG. 5 contained within block 40 will be briefly described for the sake of completeness, demonstrating how the band Z of FIG. 2 is dealt with. A further description is given in the aforementioned co-pending application. Block 40 comprises a mixer M3 fed from an intermediate point in the main path, i.e. between M1 and M2 via an inverting amplifier A4. The output of the mixer is fed through a chroma filter-limiter 41 whose output is added to the main path signal in the record mode, to achieve compression, A3 being an inverting amplifier to achieve this situation, such addition being via RL5A, A3 and M1. The output of the limiter is subtracted from the main path signal in the playback mode via RL4B and M2. In this way Type 2 compressor and expander configurations are established for the chroma signal.

However, M3 is employed effectively to subtract from the signal provided by A4 a second signal component which is provided from the main path input 32 via RL3A in the record mode and from the main path output 33 via RL3B in the playback mode and which is subjected to a two line delay in chroma delay 42 in the case of a PAL system signal. This delay has the effect that the chroma sub-carrier is cancelled at the output of the mixer M3 and does not therefore cause the limiter 41 permanently to limit, which would choke the noise reduction action. For a simple NTSC system, the delay 42 can be one line or two lines. Longer delay times can be used if required.

I claim:

1. A circuit for modifying the dynamic range of a signal, comprising a main signal path arranged to transmit a main signal component with dynamic range linearity from an input terminal to an output terminal, a filter having an input terminal connected to a point in the main path, a first output terminal connected to the input terminal through a resistive impedance, a second output terminal connected to the input terminal through the series combination of the resistive impedance, reactive impedance means and a current amplifier whose input constitutes a virtual earth, first and second limiting means for limiting the two signals at said first and second output terminals, and combining means for combining the said two signals with the main signal component so that the said two signals jointly boost or jointly buck the main signal component.

2. A circuit according to claim 1, further comprising a high pass filter coupling the first output terminal to said combining means.

3. A circuit according to claim 1, wherein said reactive impedance means is a tuned circuit.

4. A circuit according to claim 3, further comprising a trap circuit coupling the second output terminal to said combining means, the trap circuit being tuned more sharply than said tuned circuit.

5. A circuit according to claim 4, wherein said trap circuit comprises two capacitors in series in a series arm, an inductor bridging the two capacitors, and a resistive shunt arm connected to the junction of the two capacitors and providing a resistance value such that the signal passed by the trap circuit at the tuned frequency thereof is substantially nil.

6. A circuit according to claim 1, wherein the output of said current amplifier is connected to ground through another resistive impedance.

7. A circuit for modifying the dynamic range of a signal, comprising a main signal path arranged to transmit a main signal component with dynamic range linearity from an input terminal to an output terminal, a further signal path having an input connected to a point in the main path and an output for providing a further signal component limited above a limiting threshold by limiting means in the further path, and means for combining the further signal component with the main signal component so as either to boost or buck the main signal component, wherein the further signal path includes a trap circuit for rejecting a carrier frequency, the trap circuit comprising two capacitors in series in a series arm, an inductor bridging the two capacitors, and a resistive shunt arm connected to the junction of the two capacitors and providing a resistance value such that the signal passed by the trap circuit at the tuned frequency thereof is substantially nil.

* * * * *